(12) United States Patent  
Wu et al.

(10) Patent No.: US 9,076,764 B2  
(45) Date of Patent: Jul. 7, 2015

(54) TUNNELING TRANSISTOR WITH ASYMMETRIC GATE

(71) Applicant: National Tsing Hua University, Hsinchu (TW)

(72) Inventors: Yung-Chun Wu, Hsinchu (TW); Yi-Ruei Jhan, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 110 days.

(21) Appl. No.: 14/052,083

(22) Filed: Oct. 11, 2013

(65) Prior Publication Data

US 2015/0021654 A1    Jan. 22, 2015

(30) Foreign Application Priority Data

Jul. 16, 2013  (TW) .............................. 102125351 A (51) Int. Cl.
| | |
|---|---|
| *H01L 29/66* | (2006.01) |
| *H01L 29/423* | (2006.01) |
| *H01L 29/739* | (2006.01) |
| *H01L 29/06* | (2006.01) |

(52) U.S. Cl.
CPC ...... *H01L 29/42356* (2013.01); *H01L 29/7391* (2013.01); *H01L 29/0657* (2013.01)

(58) Field of Classification Search
CPC ..................... H01L 29/4983; H01L 29/66977
USPC ........................................................... 257/105
See application file for complete search history.

(56) References Cited

U.S. PATENT DOCUMENTS 7,446,372 B2 *  11/2008  Forbes ........................ 257/328
2012/0153263 A1   6/2012  Chu-Kung et al.

* cited by examiner

*Primary Examiner* — Mohammad Islam
*Assistant Examiner* — Ankush Singal
(74) *Attorney, Agent, or Firm* — Muncy, Geissler, Olds & Lowe, P.C.

(57) ABSTRACT

An asymmetric gate tunneling transistor includes a substrate, a first-polarity portion, a second-polarity portion, a channel portion, a gate structure and an insulation body. The first-polarity portion and the second-polarity portion are disposed on the substrate. The channel portion is connected with the first-polarity portion and the second-polarity portion, and includes a first section and a second section. The gate structure includes an enveloping portion surrounding the first section, and a flat portion covering one side of the second section away from the substrate. The insulation body includes a first insulation portion disposed between the first section and the enveloping portion, and a second insulation portion disposed between the second section and the flat portion. Through the asymmetric design of the gate structure, the tunneling transistor is offered with features of a high ON current and a low OFF current.

7 Claims, 9 Drawing Sheets

TUNNELING TRANSISTOR WITH ASYMMETRIC GATE

FIELD OF THE INVENTION

The present invention relates to a transistor, and particularly to a tunneling transistor with an asymmetric gate.

BACKGROUND OF THE INVENTION

As electronic products continue to progress, designs of integrated circuits are developed towards trends of higher density, faster operating speed and lower power consumption to meet market demands. As a result, critical dimension of semiconductor elements are constantly reduced by following the Moore's law. However, the miniaturization process of conventional transistors encounters various challenges, e.g., a short-channel effect. As a channel of a transistor becoming shorter, a threshold voltage ($V_{th}$) is decreased to lead to issues of an increased leakage current and increased power consumption.

To mitigate negative effects of the short-channel effect, a variety of transistors have been developed. Among the transistors, a tunneling transistor is the most prominent one. In the US Patent Publication No. 20120153263, it disclosed when a tunneling field-effect transistor in an OFF state, a drain voltage ($V_d$) is positive and a gate voltage ($V_g$) is substantially zero. That is, in such OFF state, electrons do not pass through an intrinsic channel between a source and the drain. When the transistor is in an ON state, the drain voltage ($V_d$) and the gate voltage ($V_g$) are both positive. That is, in such ON state, electrons pass through the intrinsic channel between the source and the drain. As a bandgap of the intrinsic channel ($B_c$) is transferred due to the gate voltage ($V_g$) is higher with respect to a bandgap of source ($B_s$), electrons are allow to flow. Accordingly, the tunneling field-effect transistor has a larger ON/OFF current compared to a conventional metal-oxide semiconductor field-effect transistor (MOSFET).

However, in order to implement a lower OFF current, the tunneling field-effect transistor cannot obtain a larger ON current. Therefore, a solution for overcoming such issue is needed.

SUMMARY OF THE INVENTION

Therefore the primary object of the present invention is to overcome an issue of an incapability of providing a higher ON current of a conventional tunneling field effect transistor.

To achieve the above objet, the present invention provides a tunneling transistor with an asymmetric gate that comprises a substrate, a first-polarity portion, a second-polarity portion, a channel portion, a gate structure and an insulation body. The first-polarity portion and the second-polarity portion, which are disposed on the substrate and spaced from each other, have different polarities. The channel portion is connected with the first-polarity portion and the second-polarity portion, and is disposed on the substrate. Further, the channel portion includes a first section and a second section connected to the first section. The gate structure includes an enveloping portion surrounding the first section, and a flat portion covering one side of the second section away from the substrate. The insulation body includes a first insulation portion and a second insulation portion. The first insulation portion is disposed between the first section and the enveloping portion, and the second insulation portion is disposed between the second section and the flat portion.

As such, in the gate structure of the present invention, through the enveloping portion surrounding the first section and the flat portion covering the second section, the tunneling transistor is offered with advantages of having a high ON current and a low OFF current.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1A:
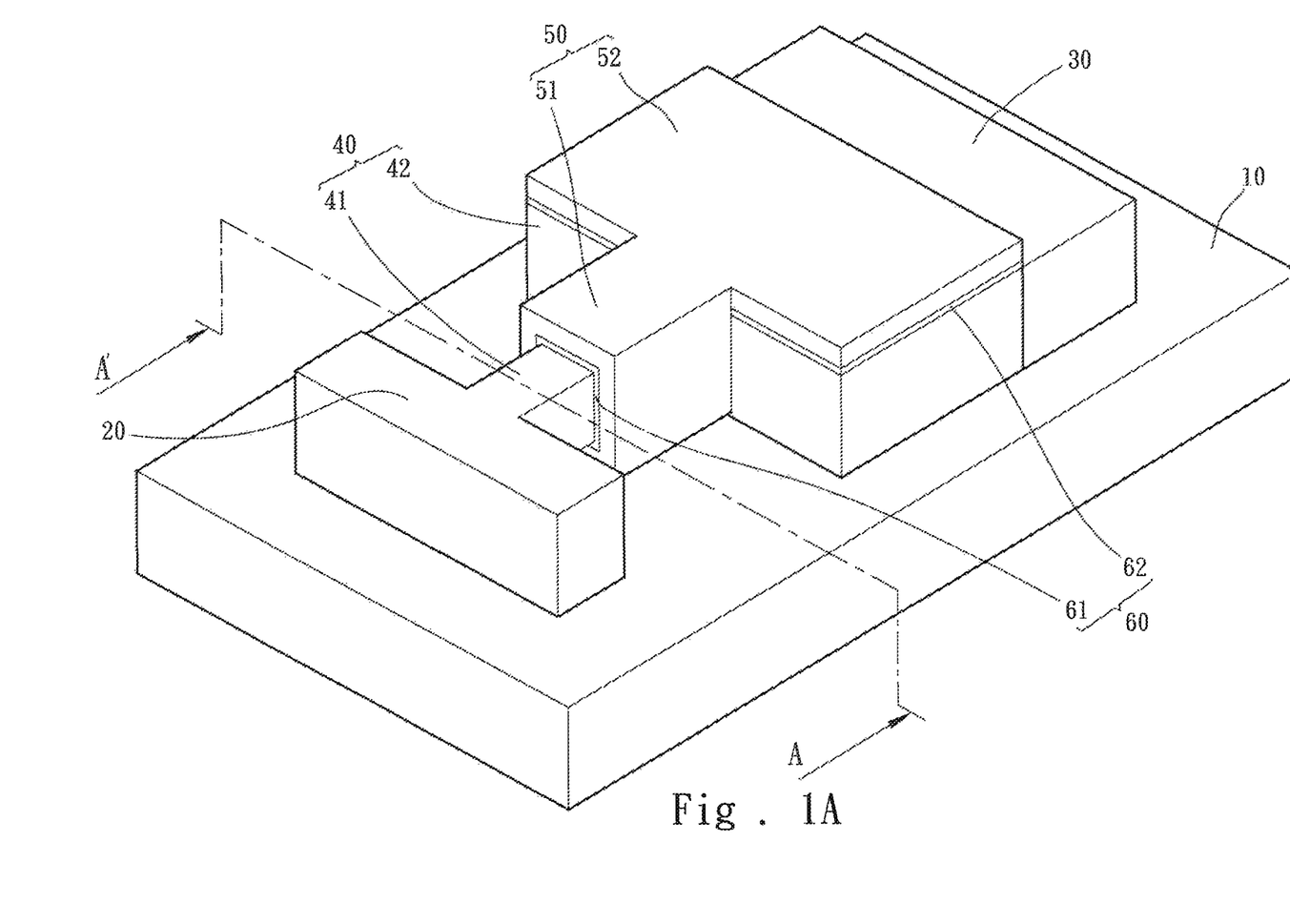
FIG. 1A is a perspective view of a first embodiment of the present invention.
Figure 1B:
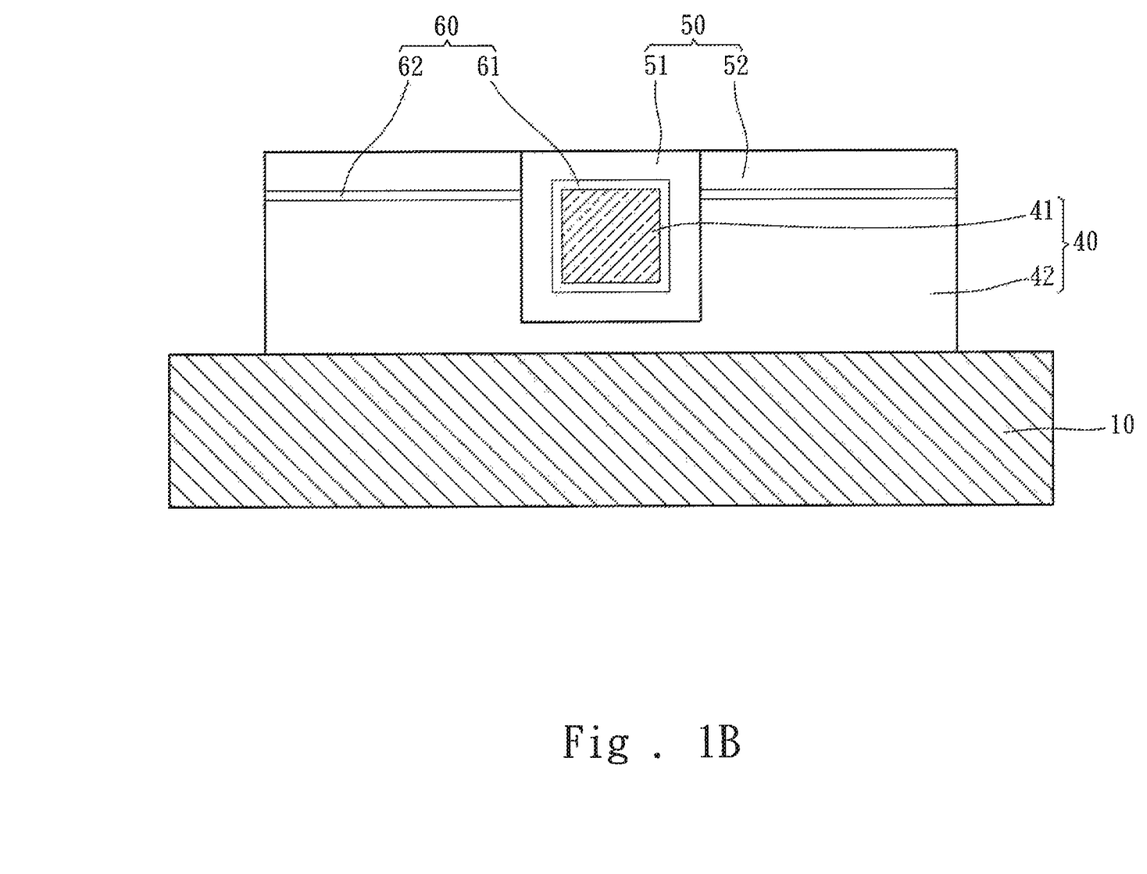
FIG. 1B is a sectional view of the first embodiment of the present invention.

FIGS. 1A and 1B are a perspective view and a sectional view of a first embodiment of the present invention. Referring to FIGS. 1A and 1B, an asymmetric gate tunneling transistor of the present invention comprises a substrate 10, a first-polarity portion 20, a second-polarity portion 30, a channel portion 40, a gate structure 50, and an insulation body 60. The substrate 10 can be made of silicon dioxide but not limited. Alternatively, the substrate 10 may be made of monocrystalline silicon. The first-polarity portion 20 and the second-polarity portion 30, which may be made of polycrystalline silicon, monocrystalline silicon or gallium arsenide, are disposed on the substrate 10. Further, the first-polarity portion 20 and the second-polarity portion 30 are spaced from each other and have different polarities. In the embodiment, the first-polarity portion 20 is doped with P-type elements to form a P-type semiconductor, and the second-polarity portion 30 is doped with N-type elements to form an N-type semiconductor.

The channel portion 40, which may be formed by monocrystalline silicon, polycrystalline silicon or germanium, is connected with the first-polarity portion 20 and the second-polarity portion 30, and is disposed on the substrate 10 to form an N-type channel intrinsic semiconductor. The channel portion 40 includes a first section 41, and a second section 42 connected to the first section 41. In the embodiment, the first section 41 is connected to the first-polarity portion 20, and the second section 42 is connected with the first section 41 and the second-polarity portion 30. The second section may 42 may form at a width same as that of the second-polarity portion 30 to simplify manufacture process. Furthermore, the first-polarity portion 20 may also be doped to form an N-type semiconductor, the second-polarity section 30 may be doped to form a P-type semiconductor, and the channel portion 40 forms a P-type channel intrinsic semiconductor.

The gate structure 50, which may be made of a metal material, includes an enveloping portion 51 surrounding the first section 41, and a flat portion 52 covering one side of the second section 42 away from the substrate 10. In the embodiment, the enveloping portion 51 and the flat portion 52 are adjacent and connected to each other. The insulation body 60, which may be made of a high dielectric material, includes a first insulation portion 61 and a second insulation portion 62. The first insulation portion 61 is disposed between the first section 41 and the enveloping portion 51, and the second insulation body 62 is disposed between the second section 42 and the flat portion 52.

Figure 2:
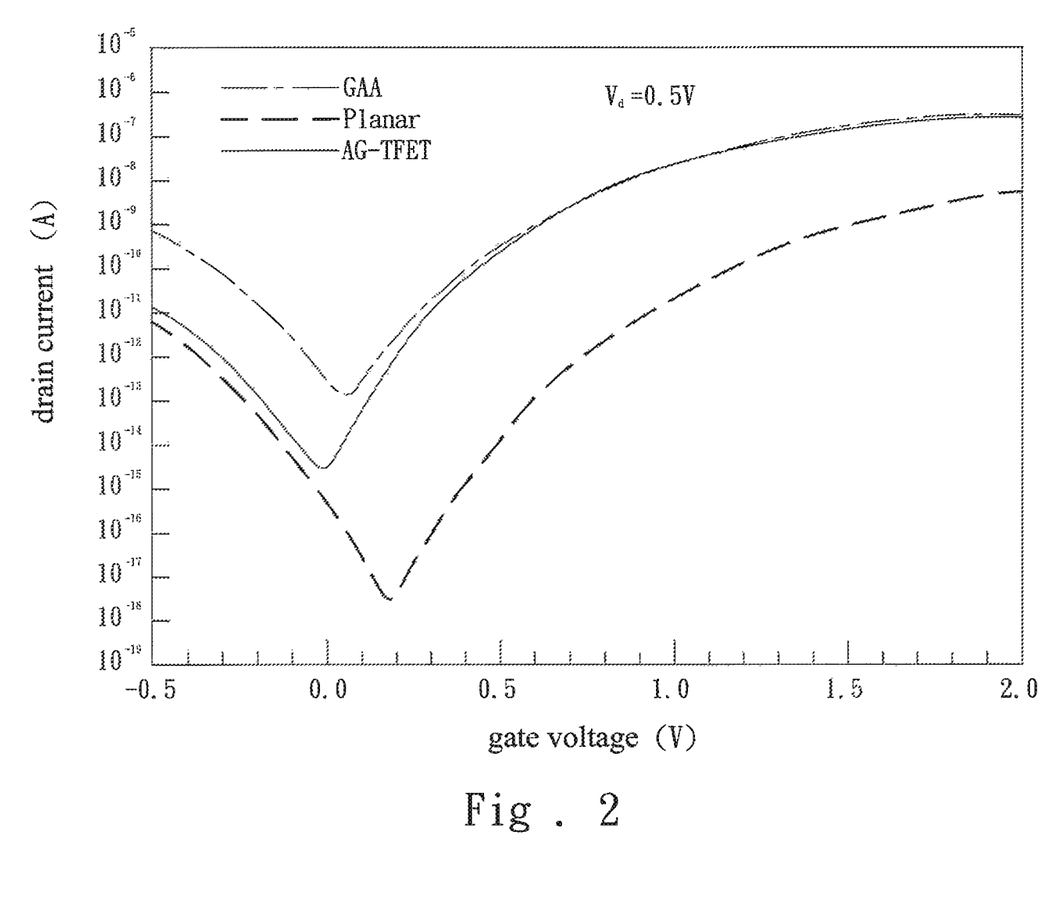
FIG. 2 is a curve of comparison of electrical characteristics among the first embodiment of the present invention, a conventional ring-gate transistor and a conventional planar-gate transistor.

FIG. 2 shows a curve of comparison of electrical characteristics among the first embodiment of the present invention, a conventional ring-gate transistor and a planar-gate transistor. In the embodiment of the present invention, the gate structure 50 has a work function of 4.55 eV and a length of 50 nm. Besides, the enveloping portion 51 for controlling the first section 41 of the channel portion 40 has a length of 25 nm, and the flat portion 52 for controlling the second section 42 of the channel portion 40 has a length of 25 nm. Cross-sectional area of the first section 41 is 10×10 nm$^2$, and that of the second section 42 is 30×100 nm$^2$. Thicknesses of both the first insulation portion 61 and the second insulation portion 62 are 2 nm. Doping concentrations of the first-polarity portion 20 and the second-polarity portion 30 are both $10^{20}$ cm$^{-3}$, and that of the channel portion 40 is $10^{16}$ cm$^{-3}$. As shown in FIG. 2, when applying a 0.5V bias ($V_d$) at a drain (the second-polarity portion 30), the tunneling transistor with an asymmetric gate (AG-TFET) of the present invention has a greater ON current ($I_{on}$) compared to the conventional planar-gate transistor (Planar), and has a lower OFF current ($I_{off}$) compared to the conventional ring-gate transistor (GAA).

Figure 3:
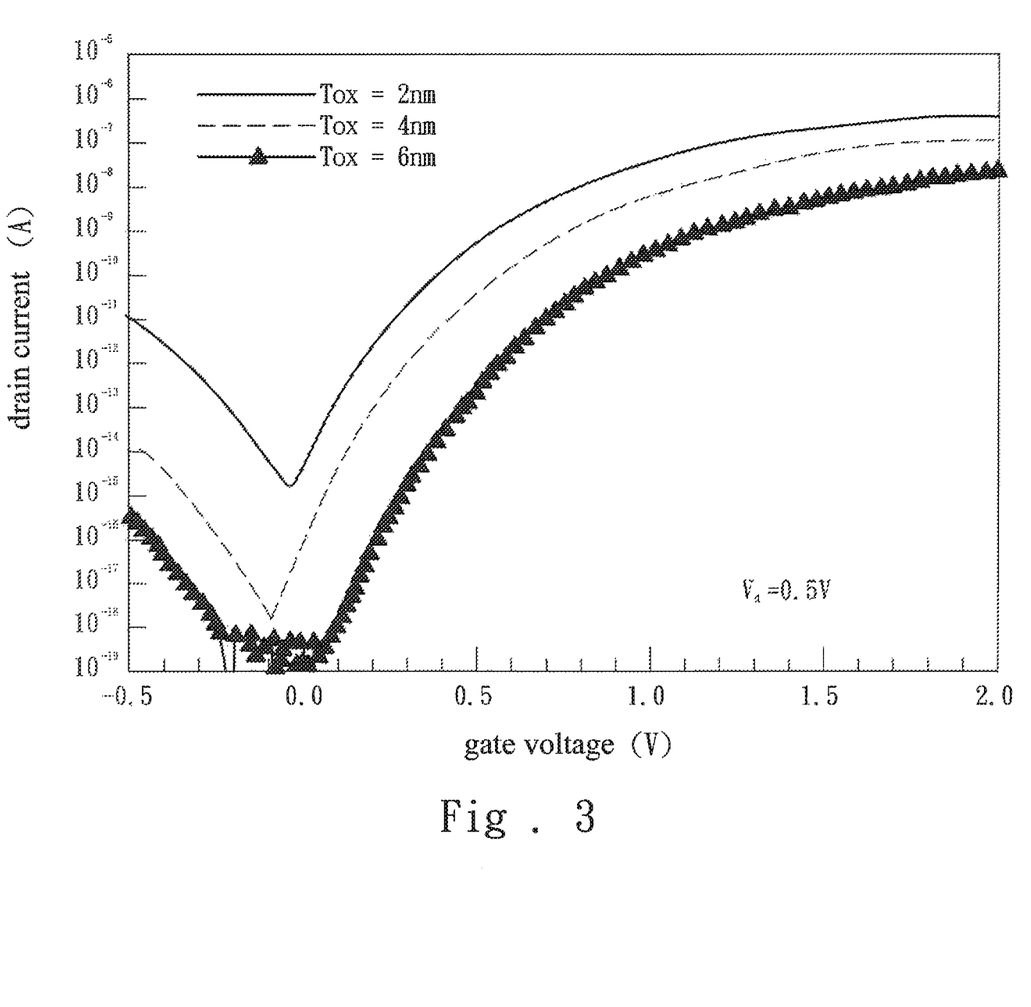
FIG. 3 is a curve of electrical characteristics of the first embodiment of the present invention with variable thickness of an insulation body.
Figure 4:
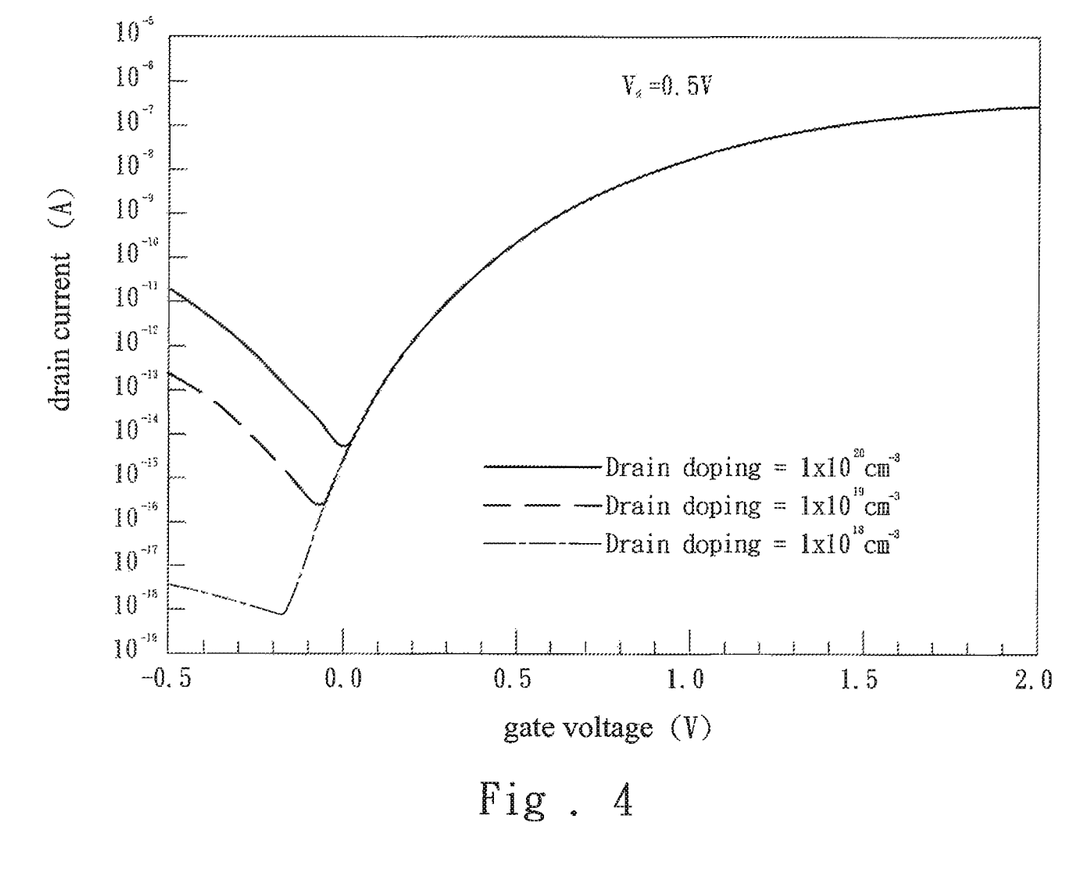
FIG. 4 is a curve of electrical characteristics of the first embodiment of the present invention with variable doping concentration of a first-polarity portion.

FIG. 3 shows a curve of electrical characteristics of the first embodiment of the present invention with variable thickness of the insulation body. In the embodiment of the present invention, as shown in FIG. 3, an ambipolar current increases as the thickness (Tox) of the insulation body 60 decreases. As shown in FIG. 4, the ambipolar current lowers as the doping concentration of the first-polarity portion 20 decreases.

Figure 5A:
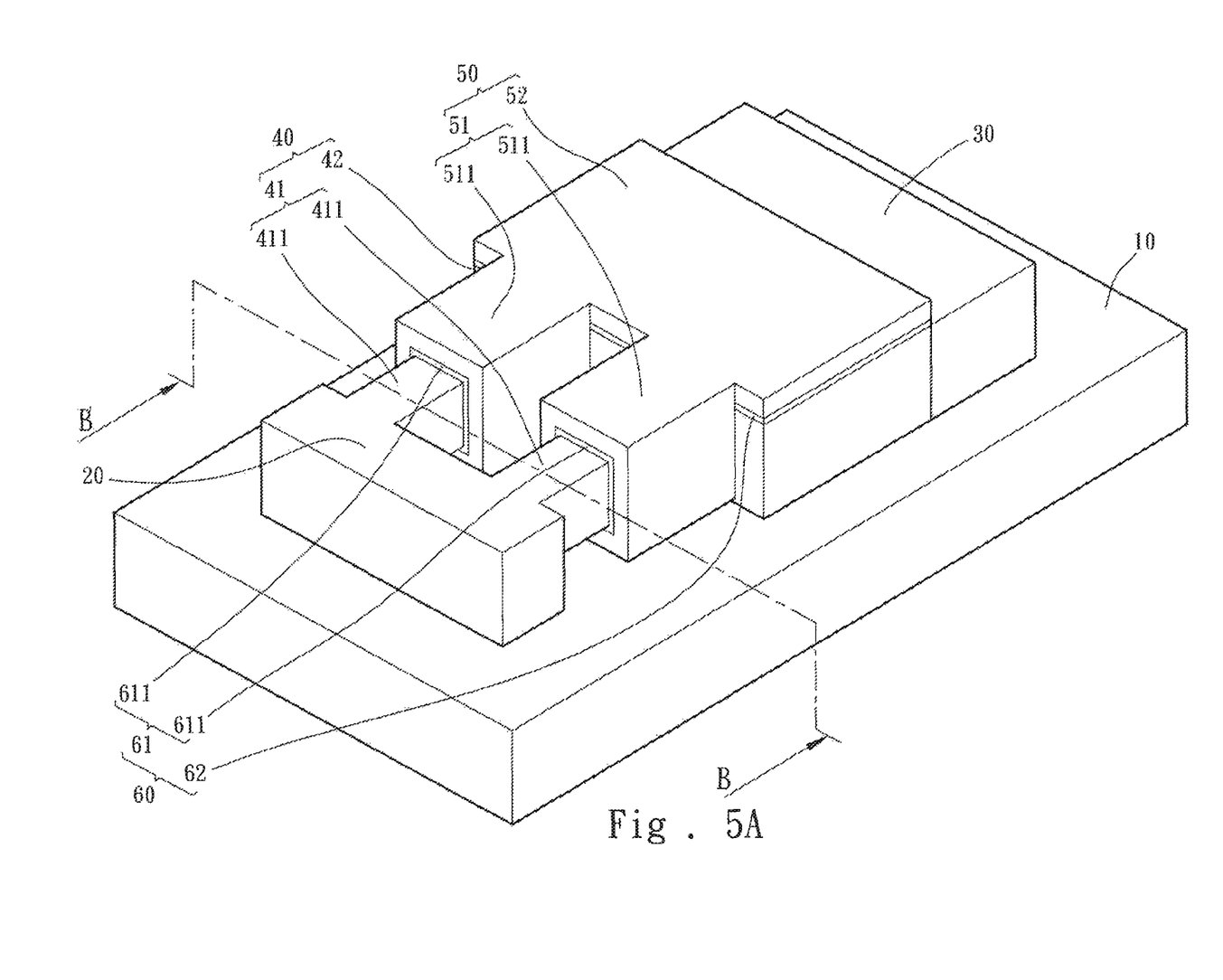
FIG. 5A is a, perspective view of a second embodiment of the present invention.
Figure 5B:
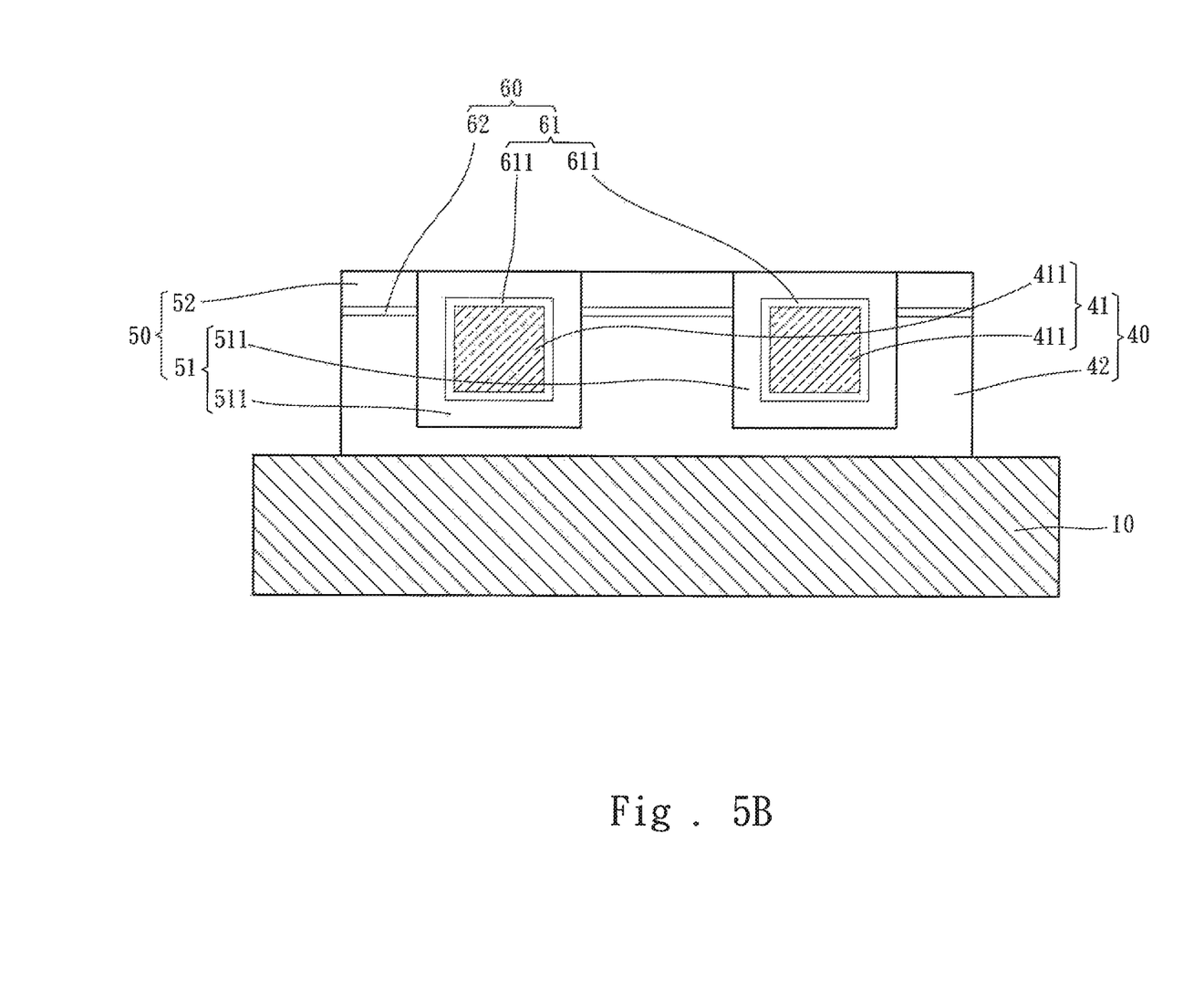
FIG. 5B is sectional view of the second embodiment of the present invention.
Figure 6A:
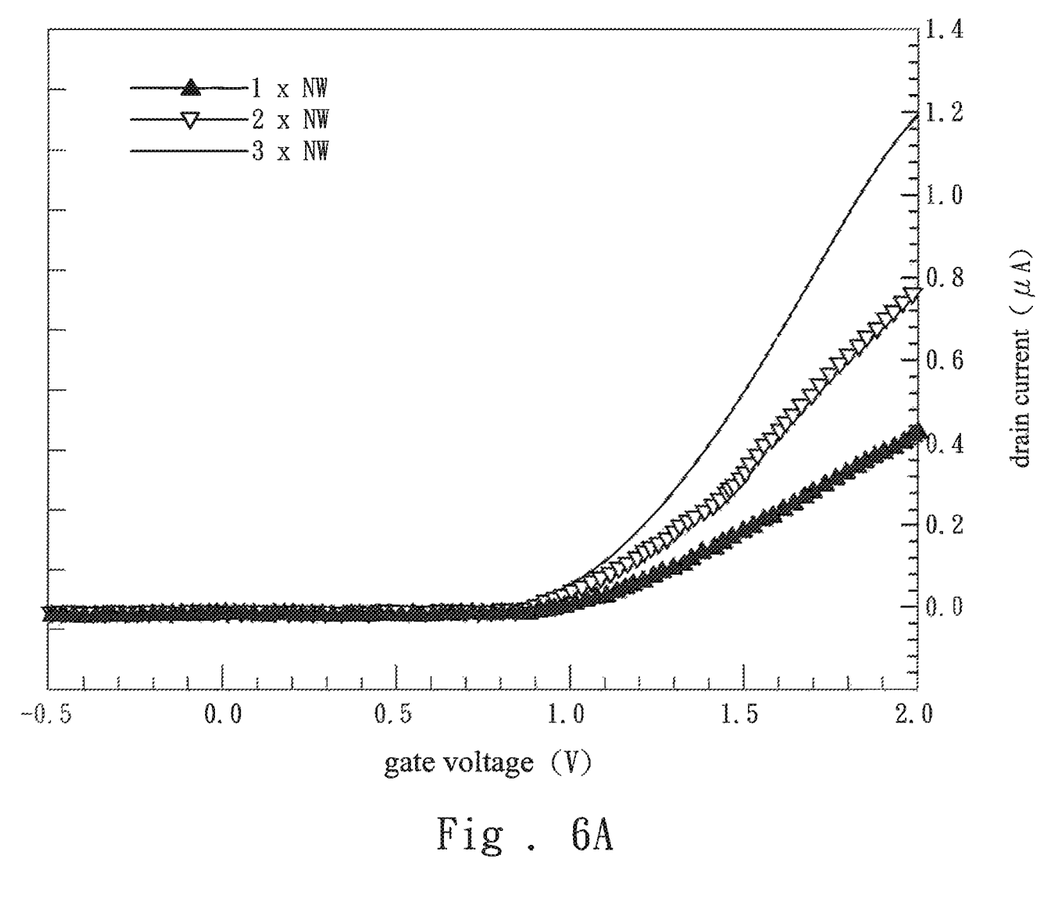
FIGS. 6A and 6B are curves of electrical characteristics of the second embodiment of the present invention with variable number of narrow wires.
Figure 6B:
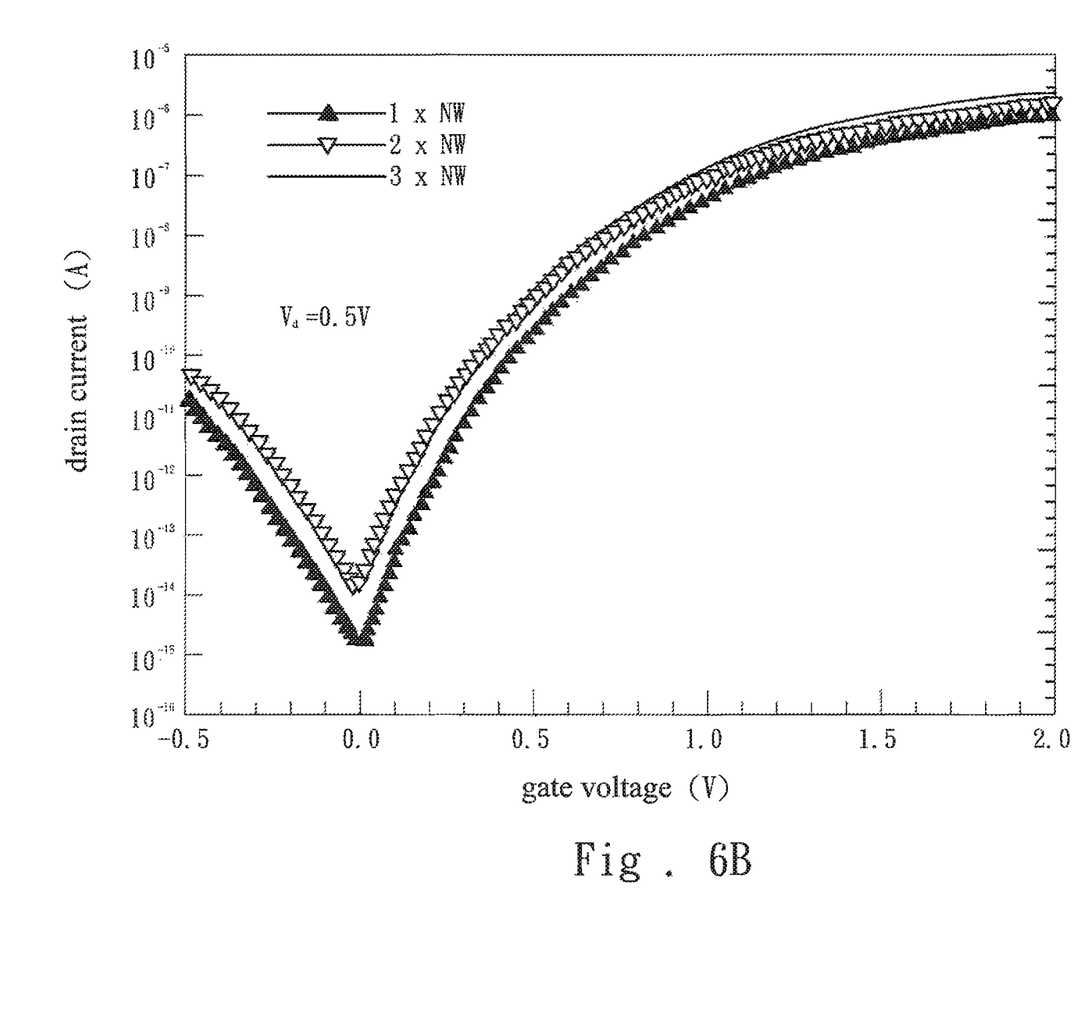

FIGS. 5A and 5B are respectively a perspective view and a sectional view of a second embodiment of the present invention, and FIGS. 6A and 6B are curves of electrical characteristics of the second embodiment of the present invention with variable number of narrow wires. Comparing to the first embodiment, the second embodiment is characterized that the first section 41 of the channel portion 40 includes a plurality of narrow wires 411 connected with the first-polarity portion 20 and the second section 42. The enveloping portion 51 includes a plurality of enveloping layers 511 correspondingly surrounding the narrow wires 411. Further, the first insulation portion 61 includes a plurality of insulation layers 611 correspondingly disposed between the narrow wires 411 and the enveloping layers 511. In the embodiment, two narrow wires 411 are given as an example, but not the limitation. The number of narrow wires 411 may be more than two in other embodiments, depending on practical requirements. Referring to FIGS. 6A and 6B, wherein $V_d$ is an applied bias of the drain, 1xNW represents one narrow wire 411, 2xNW represents two narrow wires 411, and 3xNW represents three narrow wires 411. As shown in FIG. 6A, the ON current increases in multiple as the number of narrow wires 411 increases. For example, when the gate voltage is 2V, the ON currents of 1xNW, 2xNW and 3xNW are 0.4 µA, 0.8 µA and 1.2 µA, respectively. On the other hand, as shown in FIG. 6B, the OFF currents of 1xNW, 2xNW and 3xNW are not apparently increased.

In conclusion, in gate structure of the present invention, through the enveloping portion surrounding the first section and the flat portion covering the second section, the tunneling transistor is offered with advantages of having a high ON current and a low OFF current. Also, the ambipolar current of the present invention can be adjusted by changing the thickness of the insulation body or the doping concentration of the first-polarity portion. Further, the present invention is able to increase the ON current effectively through changing a number of the narrow wires.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A tunneling transistor with an asymmetric gate, comprising:
    a substrate;
    a first-polarity portion and a second-polarity portion, which are disposed on the substrate and spaced from each other, having different polarities;
    a channel portion, which is connected with the first-polarity portion and the second-polarity portion and disposed on the substrate, including a first section and a second section connected to the first section;
    a gate structure including an enveloping portion surrounding the first section and a flat portion covering one side of the second section away from the substrate; and
    an insulation body including a first insulation portion disposed between the first section and the enveloping portion, and a second insulation portion disposed between the second section and the flat portion.

2. The asymmetric gate tunneling transistor of claim 1, wherein the first-polarity portion is a P-type semiconductor, the second-polarity portion is an N-type semiconductor, and the channel portion is an intrinsic semiconductor.

3. The asymmetric gate tunneling transistor of claim 1, wherein the first-polarity portion is an N-type semiconductor, the second-polarity portion is a P-type semiconductor, and the channel portion is an intrinsic semiconductor.

4. The asymmetric gate tunneling transistor of claim 1, wherein the second section is connected to the second-polarity portion and formed at a width same as that of the second-polarity portion.

5. The asymmetric gate tunneling transistor of claim 1, wherein the first section is connected with the first-polarity portion and the second section, and includes a plurality of narrow wires connected with the first-polarity portion and the second section.

6. The asymmetric gate tunneling transistor of claim 5, wherein the enveloping portion includes a plurality of enveloping layers correspondingly surrounding the narrow wires.

7. The asymmetric gate tunneling transistor of claim 6, wherein the first insulation portion includes a plurality of insulation layers correspondingly disposed between the narrow wires and the enveloping layers.

* * * * *